(12) United States Patent
Shikata et al.

(10) Patent No.: US 6,552,958 B2
(45) Date of Patent: Apr. 22, 2003

(54) SEMICONDUCTOR INTEGRATED CIRCUIT DEVICE

(75) Inventors: Takashi Shikata, Kawasaki (JP); Taizoh Satoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/061,156

(22) Filed: Feb. 4, 2002

(65) Prior Publication Data
US 2002/0159326 A1 Oct. 31, 2002

(30) Foreign Application Priority Data
Apr. 27, 2001 (JP) ........................ 2001-133036

(51) Int. Cl.[7] ................................................. G11C 8/00
(52) U.S. Cl. ........................................................ 365/233
(58) Field of Search ............................. 365/233, 233.5, 365/194

(56) References Cited

U.S. PATENT DOCUMENTS

| | | | | |
|---|---|---|---|---|
| 5,455,803 A | * | 10/1995 | Kodama | 365/233 |
| 5,881,019 A | * | 3/1999 | Voshikawa | 365/233 |
| 5,917,761 A | * | 6/1999 | Tietjen et al. | 365/194 |
| 6,144,617 A | * | 11/2000 | Takai | 365/233 |

* cited by examiner

*Primary Examiner*—Tan T. Nguyen
(74) *Attorney, Agent, or Firm*—Staas & Halsey LLP

(57) ABSTRACT

In a semiconductor integrated circuit device, a first circuit has a clock generating circuit which generates a clock signal. A second circuit receives the clock signal from the clock generating circuit. The first circuit maintains the clock signal at a fixed frequency when an operating clock frequency of the first circuit is changed to another frequency. The first circuit supplies a control signal and the clock signal to the second circuit so that an operating clock frequency of the second circuit is determined based on a combination of the control signal and the clock signal.

12 Claims, 6 Drawing Sheets

SEMICONDUCTOR INTEGRATED CIRCUIT DEVICE

BACKGROUND OF THE INVENTION

1. Field of the Invention

The present invention generally relates to a semiconductor integrated circuit device, and more particularly to a semiconductor integrated circuit device such as a processor, which provides dynamic or static control of the operating clock frequency of internal modules of the device by supplying clock signals and clock sync signals thereto, in order to reduce the power consumption.

2. Description of the Related Art

A conventional method for reducing the power consumption of a processor operating on the basis of internal clocks is to perform the stepwise frequency dividing of a reference clock signal to produce a modified clock frequency. In order to carry out the conventional method, a clock sync signal for masking an internal clock in accordance with the highest internal clock speed is supplied or the frequency dividing of the internal clock is performed.

With recent developments of high-speed processors and their large-scale integration, the clock control by supplying a clock signal with a controlled clock frequency to each internal module of the processor has become an important method for providing reduction of power consumption during a time when high-speed processing is not needed.

However, the conventional method has the basic restriction that the clock speed of a controlling module of a processor (for example, a memory controller) must be higher than or equal to the clock speed of a controlled module (for example, a memory). Hence, according to the conventional method, it is difficult to use the clock speed of the controlling module lower than the clock speed of the controlled module in order to provide reduced power consumption when high-speed processing is not needed.

For example, suppose that a processor is provided with an SDRAM (synchronous dynamic random access memory) as a controlled external peripheral module and the processor includes an SDRAM controller as a controlling internal module thereof. The SDRAM is designed to work at the clock speed 133 MHz. In such a case, the basic restriction for the SDRAM controller of the processor to properly control the external SDRAM is that the SDRAM controller must work at the clock speed that is equal to a multiple of 133 MHz. In the clock line of the processor, which is connected to the external SDRAM for sending the clock signal thereto, a PLL (phase-locked loop) circuit or a DLL (delay-locked loop) circuit is usually provided for the phase matching between an internal clock of the processor and a clock signal supplied to the external SDRAM. It is necessary to maintain the operating clock frequency of the clock signal supplied to the SDRAM at a constant level (for example, 133 MHz).

In the above case, if the operating clock frequency of the clock signal supplied to the SDRAM is changed to a lower clock frequency (for example, 33 MHz), in order to provide a reduction of the power consumption of the SDRAM controller in the processor, the PLL circuit provided in the SDRAM clock line is set in an unlocked state. A certain period of the waiting time is required until the PLL circuit is returned to the locked state again, and during the waiting time data transfer between the processor and the external SDRAM cannot be performed. Further, if the operating clock frequency of the clock signal supplied to the SDRAM is maintained at the lower clock speed 33 MHz, the performance of the entire system will deteriorate.

As described above, according to the conventional method, it is difficult to use the clock speed of the controlling module lower than the clock speed of the controlled module in order to reduce power consumption when the high-speed processing is not needed.

Moreover, when designing a high-speed processor, the method for preventing the skewing of the clock signals between the internal modules of the processor has become increasingly important. As the clock speed of the processor increases and the scale of the circuit integration becomes larger, it is difficult to prevent the skewing of the clock signals between the internal modules. Specifically, when determining the layout of the processor, the number of clock buffers or the length of the clock lines is adjusted in accordance with the arrangement of individual internal modules so as to prevent the skewing of the clock signals between the internal modules. It is also necessary to perform the timing adjustment related to clock skewing.

In summary, the conventional method has the following problems. First, it is difficult to synchronize the data transfer between the controlling module and the controlled module if the clock speed of the controlling module lower than the clock speed of the controlled module is used in order to reduce the power consumption when the high-speed processing is not needed. Second, as the scale of the circuit integration becomes larger, it is difficult to prevent the skewing of the clock signals between the internal modules of the processor.

SUMMARY OF THE INVENTION

An object of the present invention is to provide an improved semiconductor integrated circuit device in which the above-described problems are eliminated.

Another object of the present invention is to provide a semiconductor integrated circuit device which reliably keeps synchronization of the data transfer between the internal modules even when the operating clock frequency is changed to a lower clock frequency.

Another object of the present invention is to provide a semiconductor integrated circuit device which is capable of preventing the skewing of the clock signals between the internal modules thereof.

The above-mentioned objects of the present invention are achieved by a semiconductor integrated circuit device comprising: a first circuit which has a clock generating circuit generating a clock signal; and a second circuit which receives the clock signal from the clock generating circuit, wherein the first circuit maintains a frequency of the clock signal at a fixed frequency when an operating clock frequency of the first circuit is changed to another clock frequency, and the first circuit supplies a control signal and the clock signal to the second circuit so that an operating clock frequency of the second circuit is determined based on a combination of the control signal and the clock signal.

The above-mentioned objects of the present invention are achieved by a semiconductor integrated circuit device comprising: a clock control unit which generates a first internal clock and a second internal clock based on an externally generated input clock signal, and generates a first clock sync signal and a second clock sync signal based on a result of comparison of a frequency of the first internal clock and a frequency of the second internal clock; and a first module which receives the first internal clock and the first and second clock sync signals and includes an internal circuit which generates a clock enable signal used to control an operating clock frequency of a second module that operates on the basis of the frequency of the second internal clock, wherein the semiconductor integrated circuit device synchronizes data transfer between the first module and the second module, regardless of whether an operating clock frequency of the first internal clock is changed to another clock frequency, by supplying the clock enable signal to the second module.

The above-mentioned objects of the present invention are achieved by a semiconductor integrated circuit device comprising: a clock control unit which generates a variable-frequency first clock signal and a first clock sync signal; and a first circuit which receives the first clock signal and the first clock sync signal and generates a fixed-frequency second clock signal and a second clock sync signal that are supplied to a second circuit, the first circuit and the second circuit performing data transfer between the first circuit and the second circuit, wherein the semiconductor integrated circuit device synchronizes, when a frequency of the first clock signal is lower than a frequency of the second clock signal, the data transfer between the first circuit and the second circuit by causing the first circuit to supply the second clock sync signal to the second circuit.

The semiconductor integrated circuit device of the present invention is effective in keeping synchronization of the data transfer between the internal modules when the operating clock frequency is changed to another clock frequency. Moreover, it is possible for the semiconductor integrated circuit device of the present invention to prevent the skewing of the clock signals between the internal modules thereof.

BRIEF DESCRIPTION OF THE DRAWING

Other objects, features and advantages of the present invention will become apparent from the following detailed description when read in conjunction with the accompanying drawings.

DETAILED DESCRIPTION OF PREFERRED EMBODIMENTS

A description will now be provided of the preferred embodiments of the present invention with reference to the accompanying drawings.

Figure 1:
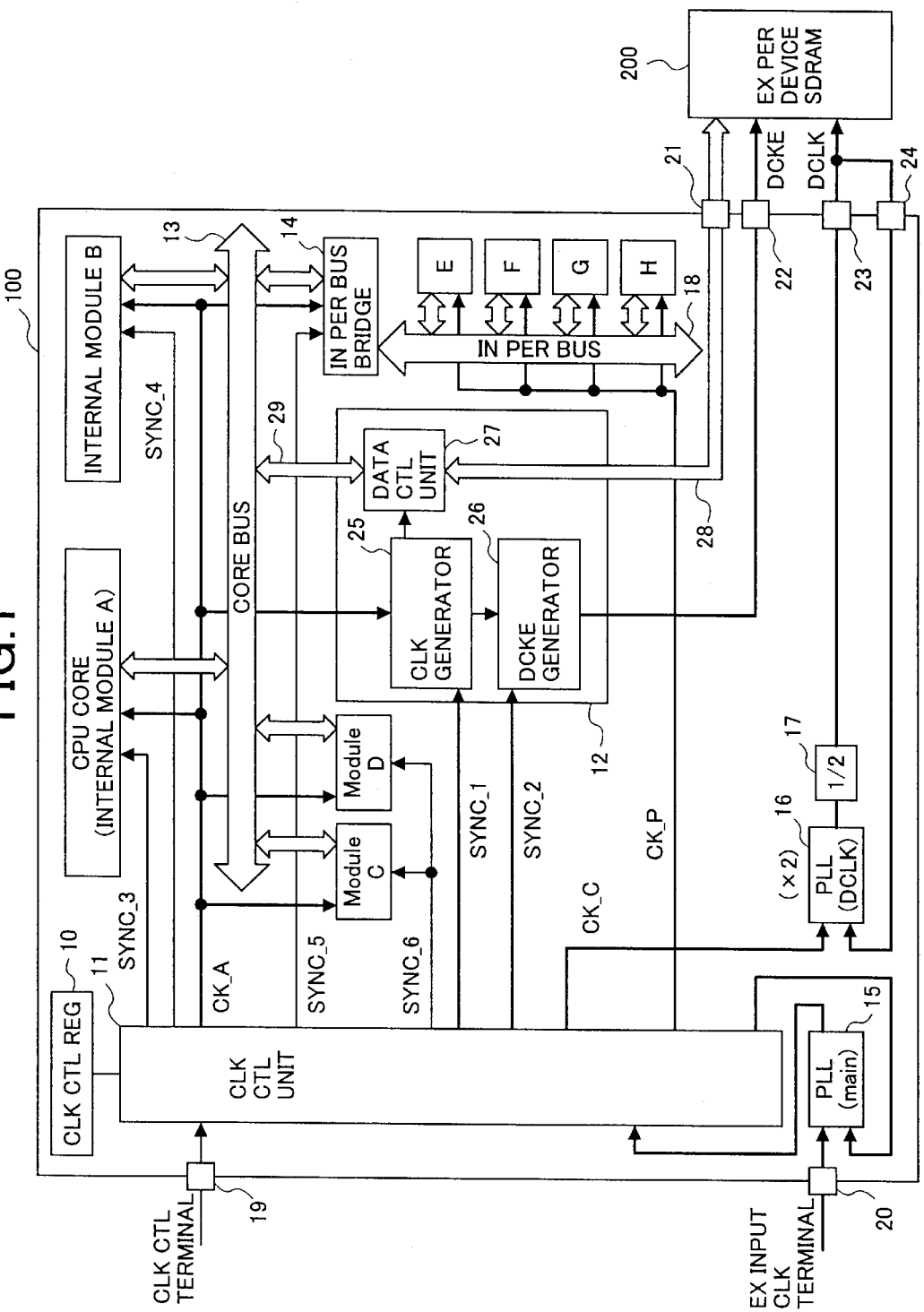
FIG. 1 is a block diagram of a first preferred embodiment of the semiconductor integrated circuit device of the invention.

FIG. 1 shows a first preferred embodiment of the semiconductor integrated circuit device of the invention.

As shown in FIG. 1, the semiconductor integrated circuit device 100 in this embodiment is a processor 100 having an internal memory controller that controls an SDRAM 200 which is provided as an external peripheral device (EX PER DEVICE) of the processor 100. The processor 100 comprises a module that is formed on a single chip, and the SDRAM 200 comprises a module that is formed on one or a plurality of chips. As will be described below, the processor 100 of the present embodiment further includes two or more other modules which are internally provided. It is preferred that the processor 100 according to the present invention be formed on a single chip. Alternatively, the processor 100 according to the present invention may be formed on a plurality of chips that are provided on a single substrate.

As shown in FIG. 1, the processor 100 is provided with a number of external terminals 19 through 24. The processor 100 receives an externally generated clock control signal via the external terminal 19, and the terminal 19 is also called the clock control (CLK CTL) terminal. The processor 100 receives an externally generated input clock signal via the external terminal 20, which is also called the external input clock (EX INPUT CLK) terminal. The processor 100 receives read-out data from the SDRAM 200 via the external terminal 21, or sends writing data to the SDRAM 200 via the external terminal 21, which is also called the data terminal. The processor 100 sends an internally generated clock signal (DCLK) to the SDRAM 200 via the external terminal 23, which is also called the DCLK terminal. The processor 100 receives the clock signal (DCLK), fed back from the terminal 23, via the external terminal 24 (which is also called the fed-back DCLK terminal). The processor 100 sends an internally generated clock enable signal DCKE to the SDRAM 200 via the external terminal 22 (which is also called the DCKE terminal). In the present embodiment, the clock enable signal DCKE is set in ON state or OFF state depending on a result of comparison of the frequency of an internal clock CK_A, which will be described later, and the frequency of an internal clock CK_C, which will be described later. When the clock enable signal DCKE is set in OFF state (when the logic level of the DCKE is set to the low level), the clock signal DCLK, received from the processor 100, is masked so as to produce a modified clock frequency, and the masked clock signal DCLK is supplied to the internal circuits of the SDRAM 200.

In the processor 100 of the present embodiment, the clock signal DCLK with a fixed clock frequency is internally generated and supplied to the external peripheral modules, such as the SDRAM 200, regardless of whether the operating clock frequency of some internal circuit of the processor 100 is changed to another clock frequency.

For example, even when the operating clock frequency of a certain internal circuit of the processor 100 is changed from 133 MHZ to 33 MHz, the clock frequency of the clock signal DCLK, internally generated in the processor 100, is maintained at a fixed clock speed 133 MHz, which is suited for the operating clock frequency of the SDRAM 200. The clock signal DCLK is supplied from the processor 100 to the SDRAM 200. When the clock frequency of the internal clock CK_A (which is changed to 33 MHz) is lower than the clock frequency of the internal clock CK_C (which is always equal to 133 MHz) as in the present example, the processor 100 sets the clock enable signal DCKE in the enable state (ON state), so that the clock signal DCLK, supplied from the processor 100 to the SDRAM 200, is masked with the ON-state clock enable signal DCKE, so as to produce the modified clock speed (which is, in the present example, 33 MHz). Then, the SDRAM 200 actually operates at the modified clock speed 33 MHz. Hence, the processor 100 and the SDRAM 200 are controlled to properly operate at the modified clock speed 33 MHz, and the data transfer between the processor 100 and the SDRAM 200 can be performed synchronously without causing the unlocking of the PLL circuit.

In the above-described embodiment of FIG. 1, the semiconductor integrated circuit device (the processor 100) comprises a first circuit, which includes a clock control unit, an SDRAM controller, a PLL circuit and a clock supplying circuit that supplies a clock signal DCLK to a second circuit (the SDRAM 200), the clock signal DCLK having a clock frequency that is maintained at a fixed level regardless of whether an operating clock frequency of the first circuit is changed to another clock frequency. The first circuit supplies a clock enable signal DCKE, in addition to the clock signal DCLK, to the second circuit 200, so that an operating clock frequency of the second circuit is determined based on a combination of the clock signal DCLK and the clock enable signal DCKE sent from the first circuit.

Next, a description will be given of the configuration of the processor 100 of the present embodiment.

As shown in FIG. 1, the processor 100 generally includes a clock control register (CLK CTL REG) 10, a clock control unit 11, an SDRAM controller 12, a core bus 13, an internal peripheral bus bridge (IN PER BUS BRIDGE) 14, a main PLL circuit 15, a second PLL circuit 16, a ½ frequency divider 17, an internal peripheral bus (IN PER BUS) 18, and a number of internal modules A through H. In the present embodiment, the internal module A is a CPU core module, and the internal modules A through D are connected onto the core bus 13 while the internal modules E through H are connected onto the internal peripheral bus 18.

In the processor 100 of the present embodiment, the clock control unit 11 receives the clock control signal via the terminal 19 and receives a PLL output signal from the PLL circuit 15. The clock control unit 11 generates internal clocks CK_A, CK_C and CK_P. Moreover, the clock control unit 11 generates various clock sync signals SYNC_1 through SYNC_6. The internal clock CK_A is a reference clock signal that provides a timing reference for the internal elements of the processor 100 and defines the length of time in which each internal element performs its function. The internal clock CK_C is a clock signal that is used to generate the clock signal DCLK to be supplied to the SDRAM 200.

In the processor 100 of the present embodiment, the clock control unit 11 is capable of receiving a stored clock control signal from the clock control register 10, instead of receiving the externally generated clock control signal. In such a case, the clock control unit 11 generates the internal clocks CK_A, CK_C and CK_P and the clock sync signals SYNC_1 through SYNC_6, such that the clock frequencies of such clock signals are controlled by performing a software processing to rewrite the contents of the clock control register 10. For example, the software processing is executed by a CPU that is provided in the CPU core.

In the processor 100 of the present embodiment, the PLL circuit 15 receives the externally generated input clock signal from the terminal 20 as well as the internally generated clock signal (which is the same as the internal clock CK_C) from the clock control unit 11, and the PLL circuit 15 outputs an internal clock, which is synchronized with the received input clock signal, to the clock control unit 11.

The internal clock CK_A, which is output by the clock control unit 11, is a variable-frequency clock signal. The clock frequency of the clock CK_A is determined by either the externally generated clock control signal or the stored clock control signal of the clock control register 10. The clock control unit 11 includes a clock-frequency setting register (not shown) provided therein. The setting value in the clock-frequency setting register is changed or updated by either the externally generated clock control signal or the stored clock control signal. The clock control unit 11 includes an oscillator (not shown) provided therein, and this oscillator is responsive to the setting value of the clock-frequency setting register and generates the internal clock CK_A, the clock frequency of which corresponds to the changed setting value of the clock-frequency setting register. The internal clock CK_A is supplied to various internal elements of the processor 100, including the internal modules A through D, the SDRAM controller 12 (which is also one of the internal modules of the processor 100) and the internal peripheral bus bridge 14.

The internal clock CK_C, which is generated by the clock control unit 11, is a variable-frequency clock signal or a fixed-frequency clock signal. The internal clock CK_C is supplied to not only the internal elements of the processor 100 to which the internal clock CK_A is supplied, but also the external modules of the processor 100.

In the present embodiment, the clock control unit 11 outputs the internal clock CK_C to the PLL circuit 16. The PLL circuit 16 acts as a phase matching circuit. The PLL circuit 16 compares the phase of the internal clock CK_C and the phase of the clock signal DCLK fed back via terminal 23, and outputs the sending clock signal DCLK to the SDRAM 200, such that the phase of the sending clock signal DCLK matches with the phase of the internal clock CK_C from the clock control unit 11. The clock frequency of the clock signal DCLK at the output of the PLL circuit 16 is divided by 2 at the frequency divider 17 so that the clock signal DCLK with the modified clock frequency is sent to the external peripheral module (the SDRAM 200) via the terminal 23. For example, when the clock frequency of the clock signal DCLK sent to the SDRAM 200 is 133 MHz, both the clock frequency of the internal clock CK_C and the clock frequency of the clock signal DCLK at the output of the PLL circuit 16 are equal to 266 MHz.

As described above, in the processor 100 of the present embodiment, the clock signal DCLK with a fixed clock frequency (for example, 133 MHz) is internally generated and supplied to the SDRAM 200, regardless of whether the operating clock frequency of some internal circuit of the processor 100 is changed to another clock frequency. Namely, the clock frequency of the internal clock CK_C of the processor 100 is fixed to 266 MHz. If the clock frequency of the internal clock CK_C of the processor 100 is changed when changing the operating clock frequency of some internal circuit of the processor 100 to another frequency in order to reduce the power consumption, this will cause the PLL circuit 16 to be set in an unlocked state. As in the above-described conventional method, a certain period of the waiting time is required until the PLL circuit 16 is returned to the locked state again, and during the waiting time the data transfer between the processor 100 and the SDRAM 200 cannot be performed.

In order to eliminate the problem of the conventional method, the processor 100 of the present embodiment is configured such that the clock signal DCLK with a fixed clock frequency is internally generated and supplied to the SDRAM 200, and, if the frequency of the internal clock CK_A after the frequency change is lower than the frequency of the internal clock CK_C, the clock enable signal DCKE is set in ON state (or the enable state) so as to produce the modified clock frequency of the clock signal DCLK for use in the SDRAM 200. According to the present embodiment, even when the clock frequency of the internal clock CK_A is changed to the lower clock frequency (33 MHz) in order to reduce the power consumption, and the operating clock frequency of the internal clock CK_A sent to some internal circuit of the processor 100 is lower than the operating clock frequency of the clock signal DCLK sent to the SDRAM 200, the SDRAM 200 actually operates at the modified clock speed 33 MHz because the clock enable signal DCKE is set in the enable state depending on the result of comparison of the frequency of the internal clock CK_A and the frequency of the internal clock CK_C. Therefore, the data transfer between the processor 100 and the SDRAM 200 can be performed synchronously without causing the unlocking of the PLL circuit even if the clock frequency of the internal clock CK_A is changed.

As shown in FIG. 1, in the processor 100 of the present embodiment, the SDRAM controller 12 generally includes an internal clock generator (CLK GENERATOR) 25, a clock enable signal generator (DCKE GENERATOR) 26 and a data control unit (DATA CTL UNIT) 27. The SDRAM controller 12 receives the internal clock CK_A, the clock sync signal SYNC_1 and the clock sync signal SYNC_2 from the clock control unit 11. Both the clock sync signals SYNC_1 and SYNC_2 are set in ON state (the enable state) or OFF state (the disable state) depending on a result of comparison of the frequency of the internal clock CK_A and the frequency of the internal clock CK_C.

FIG. 3A through FIG. 3D are timing charts for explaining operations of the semiconductor integrated circuit device in FIG. 1.

Figure 3A:
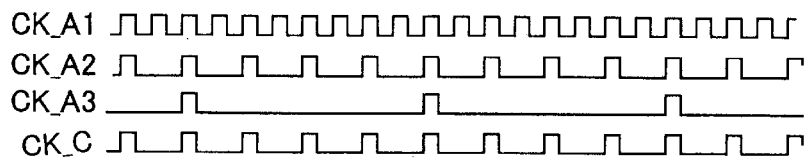
FIG. 3A through FIG. 3D are timing charts for explaining operations of the semiconductor integrated circuit device in FIG. 1.

FIG. 3A shows the waveforms of the internal clock CK_A and the internal clock CK_C. In FIG. 3A, "CK_A1" indicates the waveform of the clock CK_A in which the frequency of the clock CK_A is changed to a high clock frequency, "CK_A2" indicates the waveform in which the frequency of the internal clock CK_A is changed to a middle clock frequency, and "CK_A3" indicates the waveform in which the frequency of the internal clock CK_A is changed to a low clock frequency. The middle clock frequency of the internal clock CK_A is equal to the fixed clock frequency of the internal clock CK_C.

Figure 3B:
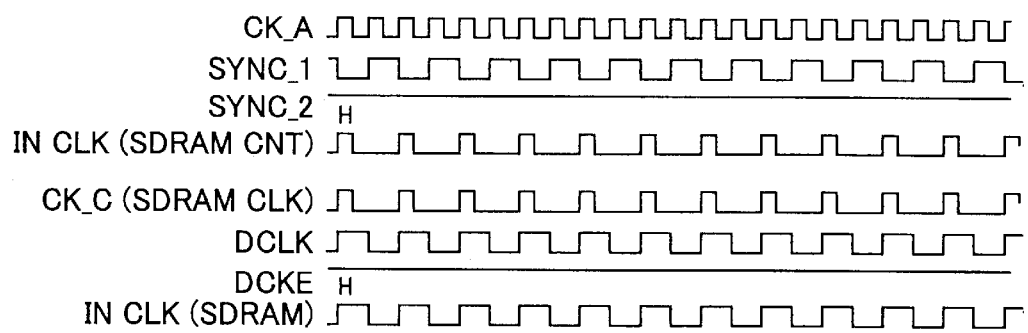
Figure 3C:
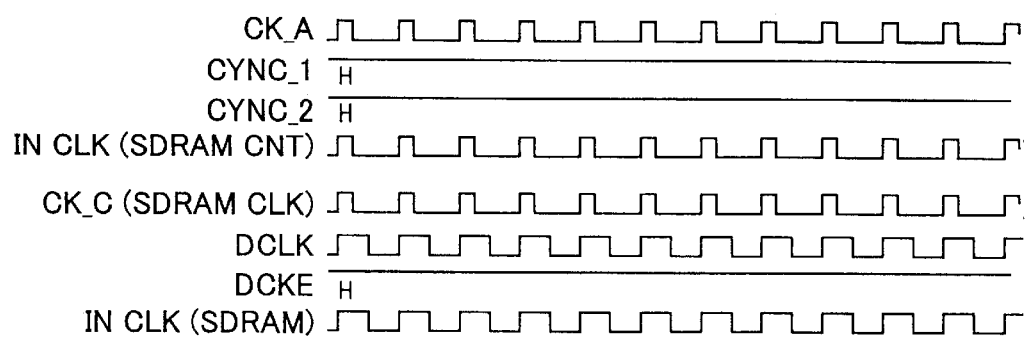
Figure 3D:
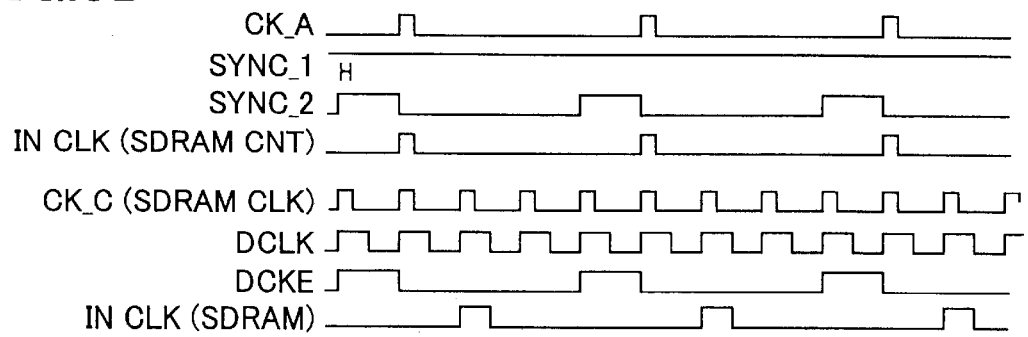

FIG. 3B shows the waveforms of the internal clocks, the clock sync signals, the clock signal and the clock enable signal of the processor 100 when the frequency of the internal clock CK_A is higher than the frequency of the internal clock CK_C. FIG. 3C shows the waveforms of the internal clocks, the clock sync signals, the clock signal and the clock enable signal of the processor 100 when the frequency of the internal clock CK_A is equal to the frequency of the internal clock CK_C. FIG. 3D shows the waveforms of the internal clocks, the clock sync signals, the clock signal and the clock enable signal of the processor 100 when the frequency of the internal clock CK_A is lower than the frequency of the internal clock CK_C.

In FIG. 3B through FIG. 3D, "CK_A" indicates the waveform of the clock CK_A, "SYNC_1" indicates the waveform of the clock sync signal SYNC_1, "SYNC_2" indicates the waveform of the clock sync signal SYNC_2, "IN CLK (SDRAM CTL)" indicates the waveform of the internal clock provided within the SDRAM controller 12, "CK_C" indicates the waveform of the clock CK_C, "DCLK" indicates the waveform of the clock signal DCLK, "DCKE" indicates the waveform of the clock enable signal DCKE, and "IN CLK (SDRAM)" indicates the waveform of the internal clock provided within the SDRAM 200.

As shown in FIG. 3B, when the frequency of the internal clock CK_A is higher than the frequency of the internal clock CK_C, the clock sync signal SYNC_1 is set in the enable state and the clock sync signal SYNC_2 is set in the disable state (fixed to the high level H).

As shown in FIG. 3C, when the frequency of the internal clock CK_A is equal to the frequency of the internal clock CK_C, the clock sync signal SYNC_1 is set in the disable state (fixed to the high level H) and the clock sync signal SYNC_2 is set in the disable state (fixed to the high level).

As shown in FIG. 3D, when the frequency of the internal clock CK_A is lower than the frequency of the internal clock CK_C, the clock sync signal SYNC_1 is set in the disable state (fixed to the high level H) and the clock sync signal SYNC_2 is set in the enable state. In this condition, the frequency of the enable-state clock sync signal SYNC_2 is the same as the frequency of the internal clock CK_A. When there is a need to reduce the power consumption of the processor 100, the processor 100 is placed into the condition shown in FIG. 3D.

Figure 2:
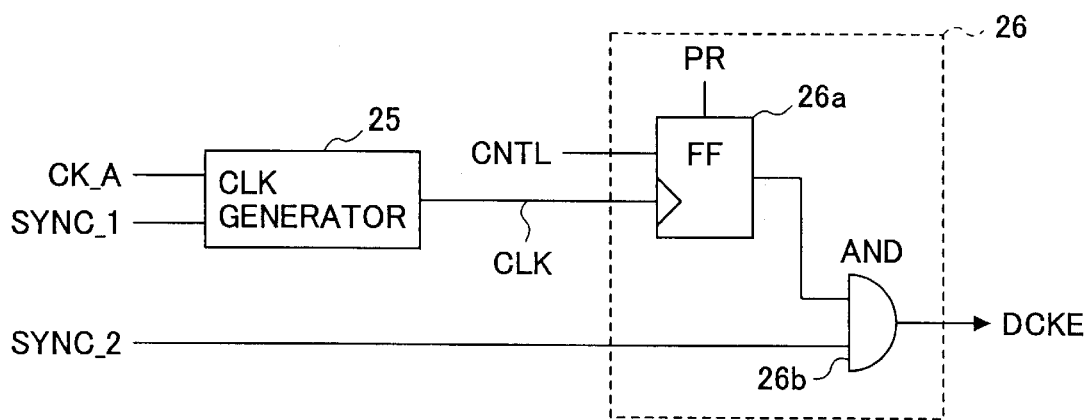
FIG. 2 is a circuit diagram of a DCKE generator in the semiconductor integrated circuit device in FIG. 1.

FIG. 2 shows a DCKE generator 26 of the SDRAM controller 12 in the semiconductor integrated circuit device in FIG. 1.

As shown in FIG. 2, the internal clock generator 25 receives the internal clock CK_A and the clock sync signal SYNC_1 from the clock control unit 11, and generates an internal clock CLK which is provided within the SDRAM controller 12. The internal clock CLK, output by the clock generator 25, is supplied to each of the data control unit 27 (not shown) and the clock enable signal generator 26.

The clock enable signal (DCKE) generator 26 includes a D flip-flop 26a and an AND gate 26b. The internal clock CLK, output by the internal clock generator 25, is supplied to a clock input of the flip-flop 26a in the DCKE generator 26. A clock control signal CNTL, internally generated in the SDRAM controller 26 to control the clock enable signal DCKE, is supplied to a data input of the flip-flop 26a. The flip-flop 26a receives the clock control signal CNTL and the internal clock CLK and sends an output signal to one of two inputs of the AND gate 26b. The clock control signal CNTL is fixed to the high level (H) during the operations of the semiconductor integrated circuit device shown in FIG. 3B through FIG. 3D. The clock sync signal SYNC 2, output by the clock control unit 11, is supplied to the other input of the AND gate 26b in the DCKE generator 26. The AND gate 26b receives the output signal of the flip-flop 26a and the clock sync signal SYNC_2 and provides the AND logic of the two signals. The AND gate 26b outputs the clock enable signal DCKE as a result of the AND logic, to the SDRAM 200 via the terminal 22.

When the frequency of the internal clock CK_A is higher than the frequency of the internal clock CK_C, the internal clock generator 25 of the SDRAM controller 12 generates the internal clock CLK with the pulse width, which is the same as the pulse width of the internal clock CK_A, synchroned with the falling edge of the clock sync signal SYNC_1, as shown in FIG. 3B. In the example in FIG. 3B, the clock frequency of the internal clock CLK is half the clock frequency of the internal clock CK_A.

When the frequency of the internal clock CK_A is equal to the frequency of the internal clock CK_C (FIG. 3C), or when the frequency of the internal clock CK_A is lower than the frequency of the internal clock CK_C (FIG. 3D), the internal clock generator 25 generates the internal clock CLK with the clock frequency, which is the same as the clock frequency of the received internal clock CK_A, and the internal clock CLK is output to the DCKE generator 26.

In the DCKE generator 26, the flip-flop 26a latches the clock enable signal DCKE synchronized with the edge of the internal clock CLK sent from the internal clock generator 25. The output of the flip-flop 26a is connected to one of the two inputs of the AND gate 26b, and the clock sync signal SYNC_2 is supplied to the other input of the AND gate 26b. The flip-flop 26a includes a preset input (PR), and when a preset signal, output by the clock control unit 11 or the like, is supplied to the present input of the flip-flop 26a, the output signal of the flip-flop 26a is set to zero.

When the frequency of the internal clock CK_A is higher than the frequency of the internal clock CK_C (FIG. 3B), or when the frequency of the internal clock CK_A is equal to the frequency of the internal clock CK_C (FIG. 3C), the clock enable signal DCKE at the output of the AND gate 26b is fixed to the high level H (the enable state) and the clock sync signal SYNC_2 is fixed to the high level H.

On the other hand, when the frequency of the internal clock CK_A is lower than the frequency of the internal clock CK_C (FIG. 3D), the clock sync signal SYNC_2 is passed through the AND gate 26b without change and the SDRAM controller 12 outputs such clock enable signal to the SDRAM 200 as the DCKE signal. The thus generated clock enable signal DCKE has the frequency that is equal to the frequency of each of the internal clock CK_A and the clock sync signal SYNC_2.

In the above-described manner, the processor 100 of the present embodiment supplies the clock signal DCLK and the clock enable signal DCKE to the SDRAM 200. When the frequency of the internal clock CK_A is higher than the frequency of the internal clock CK_C, the internal clock provided within the SDRAM 200 has the frequency that is equal to the frequency of each of the internal clock CK_A and the clock signal DCLK as shown in FIG. 3B. When the frequency of the internal clock CK_A is equal to the frequency of the internal clock CK_C, the internal clock provided within the SDRAM 200 has the frequency that is equal to the frequency of each of the internal clock CK_A and the clock signal DCLK as shown in FIG. 3C.

On the other hand, when the frequency of the internal clock CK_A is lower than the frequency of the internal clock CK_C, the frequency of the clock signal DCLK supplied to the SDRAM 200 is retained as being equal to the frequency of the internal clock CK_C of the processor 100. However, as the clock enable signal DCKE supplied to the SDRAM 200 is set in the enable state, the internal clock provided within the SDRAM 200 has the frequency that is equal to the frequency of the internal clock CK_A of the processor 100 as shown in FIG. 3D. Hence, the processor 100 and the SDRAM 200 are controlled to properly operate at the lower clock speed, and the data transfer between the processor 100 (the SDRAM controller 12) and the SDRAM 200 can be performed synchronously. Even if the frequency of the internal clock CK_A of the processor 100 is changed to a lower clock frequency, the PLL circuit 16 stays in the locked state. If the frequency of the internal clock CK_A of the processor 100 is changed to a higher clock frequency and the clock enable signal DCKE is set in OFF state, the data transfer between the processor 100 and the SDRAM 200 can be performed synchronously.

In the above-described embodiment, the clock enable signal DCKE, sent to the SDRAM 200, is set in the enable state or the disable state depending on a result of comparison of the frequency of the internal clock CK_A and the frequency of the internal clock CK_C, and the clock sync signals SYNC_1 and SYNC_2 are used to produce the clock signals and the clock control signals, sent to the other internal modules of the processor 100. Regardless of whether the frequency of the internal clock CK_A is changed to a lower clock frequency or a higher clock frequency, the semiconductor integrated circuit device of the present embodiment can synchronously perform the data transfer between the controlling module and the controlled module. Further, it is possible to minimize the skewing of the clock signals between the internal modules of the processor 100.

In the above-described embodiment, the processor 100 includes the clock control unit 11 which generates the first internal clock CK_A and the second internal clock CK_C based on the externally generated input clock signal, and generates the first clock sync signal SYNC_1 and the second clock sync signal SYNC_2 based on a result of comparison of the frequency of the internal clock CK_A and the frequency of the internal clock CK_C. The processor 100 further includes the SDRAM controller 12 which receives the first internal clock CK_A and the first and second clock sync signals SYNC_1 and SYNC_2, and the SDRAM controller 12 includes the DCKE generator 26 which generates the clock enable signal DCKE used to control the operating clock frequency of the SDRAM 200 that operates on the basis of the frequency of the second internal clock CK_C (or the internal clock CLK provided within the SDRAM controller 12) supplied from the SDRAM controller 12. Hence, the semiconductor integrated circuit device of the present embodiment can synchronously perform the data transfer between the controlling module (the SDRAM controller 12) and the controlled module (the SDRAM 200), regardless of whether the operating clock frequency of the first internal clock CK_A is changed to another clock frequency.

Alternatively, the processor 100 may be configured such that it includes the clock control unit 11 which generates a first clock signal CK_A and a first clock sync signal SYNC_1 that are sent to the SDRAM controller 12, and includes the SDRAM controller 12 (the first circuit) which generates a second clock signal DCLK and a second clock sync signal DCKE (SYNC_2) that are sent to the SDRAM 200 (the second circuit). The first circuit 12 and the second circuit 200 perform data transfer between the first circuit 12 and the second circuit 200. In such alternative embodiment, the processor 100 synchronizes, when the frequency of the first clock signal CK_A is lower than the frequency of the second clock signal DCLK, the data transfer between the first circuit 12 and the second circuit 200 by causing the first circuit 12 to supply the second clock sync signal SYNC_2 to the second circuit 200.

In the above-described embodiment of FIG. 2, the internal clock CK_A is supplied to not only the SDRAM controller 12 but also the other internal modules of the processor 100, such as the module A (the CPU core) and the module B. Moreover, the clock sync signals SYNC_3 through SYNC_6 are respectively supplied to such internal modules of the processor 100. The timing of the clock sync signals sent to such internal modules of the processor 100 can be adjusted by either sending the externally generated clock control signal to the clock control unit 11 via the terminal or rewriting the stored clock control signal of the clock control register 10 through the software processing.

Figure 4:
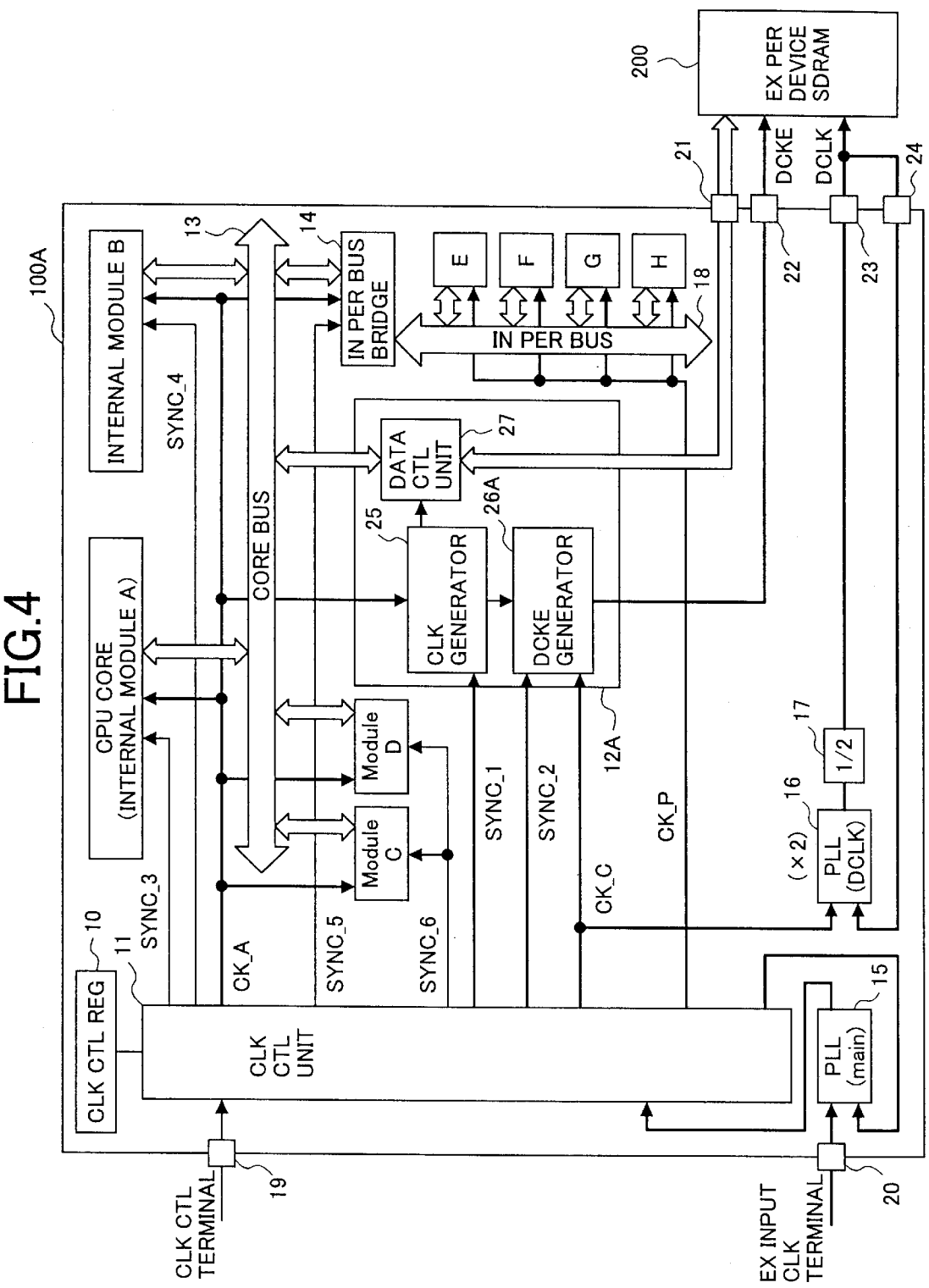
FIG. 4 is a block diagram of a second preferred embodiment of the semiconductor integrated circuit device of the invention.

Next, FIG. 4 shows a second preferred embodiment of the semiconductor integrated circuit device of the invention. In FIG. 4, the elements that are essentially the same as corresponding elements in FIG. 1 are designated by the same reference numerals, and a description thereof will be omitted.

As shown in FIG. 4, the processor 100A of the present embodiment differs from the processor 100 of the previous embodiment in FIG. 1 in that the processor 100A includes a DCKE generator 26A (shown in FIG. 5) instead of the DCKE generator 26 in the previous embodiment.

Figure 5:
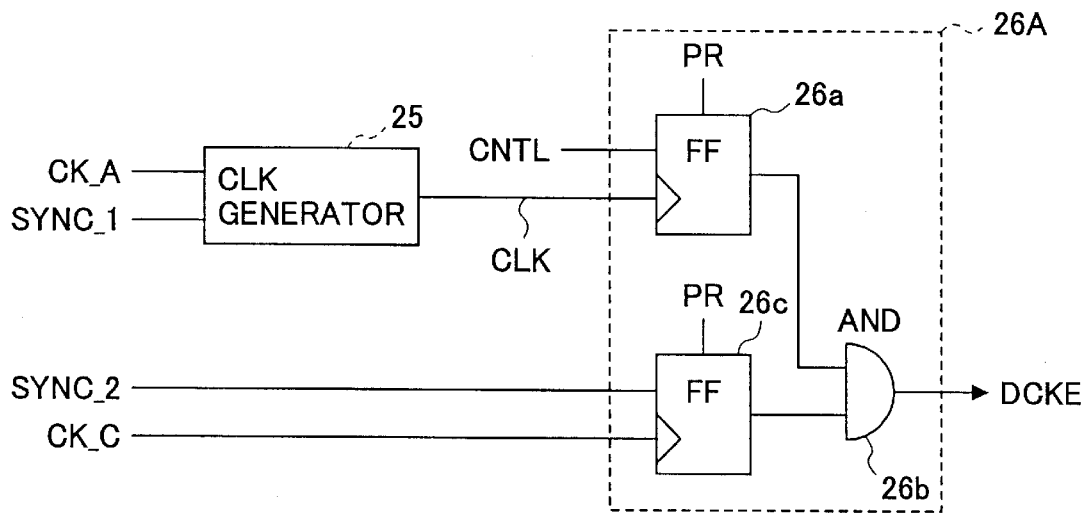
FIG. 5 is a circuit diagram of a DCKE generator in the semiconductor integrated circuit device in FIG. 4.

FIG. 5 shows a DCKE generator 26A of an SDRAM controller 12A in the semiconductor integrated circuit device in FIG. 4. In FIG. 5, the elements that are essentially the same as corresponding elements in FIG. 2 are designated by the same reference numerals, and a description thereof will be omitted.

As shown in FIG. 5, the DCKE generator 26A in the present embodiment receives the internal clock CK_C in addition to the internal clock CK_A and the clock sync signals SYNC_1 and SYNC_2. The DCKE generator 26A includes a D flip-flop 26c in addition to the D flip-flop 26a and the AND gate 26b. The internal clock CK_C, output by the clock control unit 11, is supplied to a clock input of the flip-flop 26c in the DCKE generator 26A. The clock sync signal SYNC_2, output by the clock control unit 11, is supplied to a data input of the flip-flop 26c. The flip-flop 26c receives the internal clock CK_C and the clock sync signal SYNC_2 and sends an output signal to one of the two inputs of the AND gate 26b. The AND gate 26b receives the output signal of the flip-flop 26a and the output signal of the flip-flop 26c and provides the AND logic of the two signals. The AND gate 26b outputs the clock enable signal DCKE as a result of the AND logic, to the SDRAM 200 via the terminal 22. The flip-flop 26c latches the clock sync signal SYNC_2 synchronized with the edge of the internal clock CK_C, and the timing of the clock enable signal DCKE output by the AND gate 26b accurately matches with the timing of the clock signal DCLK output by the processor 100A. Namely, the edges of the clock enable signal DCKE accurately respectively match with the edges of the clock signal DCLK.

FIG. 6A through FIG. 6D are timing charts for explaining operations of the semiconductor integrated circuit device in FIG. 4.

Figure 6A:
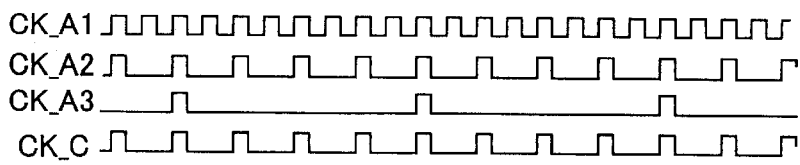
FIG. 6A through FIG. 6D are timing charts for explaining operations of the semiconductor integrated circuit device in FIG. 4.
Figure 6B:
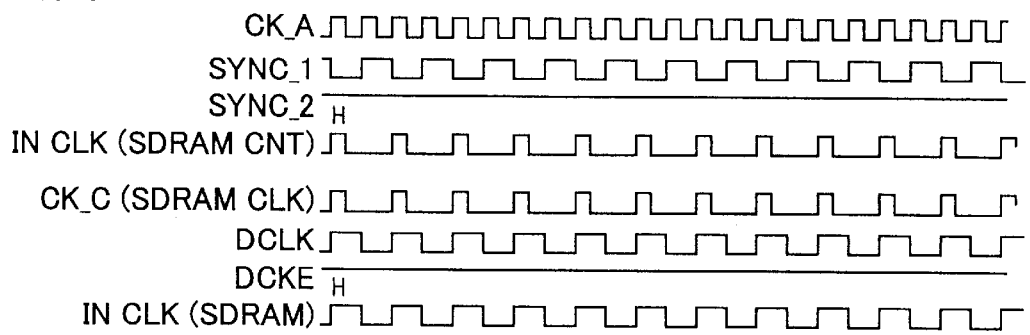
Figure 6C:
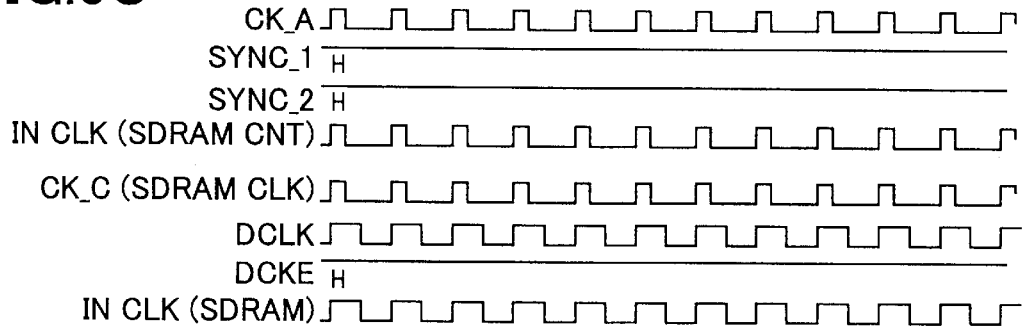
Figure 6D:
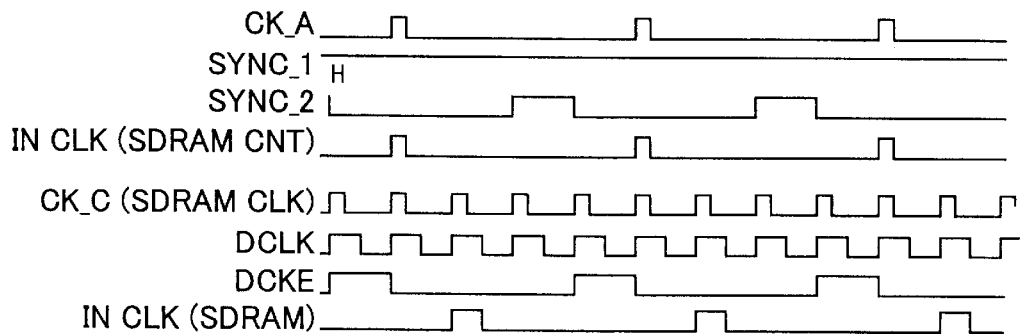

In FIG. 6A through FIG. 6D, the elements that are essentially the same as corresponding elements in FIG. 3A through FIG. 3D are designated by the same reference numerals, and a description thereof will be omitted. By comparison with the previous embodiment in FIG. 3A through FIG. 3D, the operations of the present embodiment in FIG. 6D are different from those of the previous embodiment in FIG. 3D only in that the relationship between the edges of the clock sync signal SYNC_2 and the edges of the internal clock CK_A in the present embodiment differ slightly. In addition, in the present embodiment, the output signal of the flip-flop 26a is fixed to the high level (H) during the operations shown in FIG. 6A through FIG. 6D.

In the above-described embodiments, the semiconductor integrated circuit device of the present invention synchronously performs the data transfer between the processor 100 or 100A and the external SDRAM 200 without causing the unlocking of the PLL circuit. However, the present invention is not limited to these embodiments. The semiconductor integrated circuit device of the present invention synchronously performs the data transfer between the internal modules of the processor 100 or 100A without causing the unlocking of the PLL circuit. For example, in a case in which the SDRAM 200 is provided within the processor 100 or 100A as an internal module, the present invention is also applicable to such a case in a manner similar to the above-described embodiments and it is possible to synchronously perform the data transfer between the internal controlling module and the internal controlled module.

Further, in the above-described embodiments, the semiconductor integrated circuit device according to the present invention includes the processor and the SDRAM controlled by the processor. However, the present invention is not limited to these embodiments. The semiconductor integrated circuit device according to the present invention should be considered inclusive of any other configurations that synchronously perform the data transfer between semiconductor integrated circuits.

Further, in the above-described embodiments, the semiconductor integrated circuit device according to the present invention includes the PLL circuit. Alternatively, the semiconductor integrated circuit device according to the present invention may include a DLL circuit or others which are provided for phase matching between an internal clock of the controlling module and a clock signal supplied to the external controlled module.

The present invention is not limited to the above-described embodiments, and variations and modifications may be made without departing from the scope of the present invention.

Further, the present invention is based on Japanese priority application No. 2001-133036, filed on Apr. 27, 2001, the entire contents of which are hereby incorporated by reference.

What is claimed is:

1. A semiconductor integrated circuit device comprising:
   a first circuit having a clock generating circuit generating a clock signal; and
   a second circuit receiving the clock signal from the clock generating circuit,
   wherein the first circuit maintains the clock signal at a fixed frequency when an operating clock frequency of the first circuit is changed to another frequency, and the first circuit supplies a control signal and the clock signal to the second circuit so that an operating clock frequency of the second circuit is determined based on a combination of the control signal and the clock signal.

2. The semiconductor integrated circuit device according to claim 1, wherein the first circuit supplies the clock signal and the control signal to the second circuit so that the clock signal supplied to the second circuit is masked with the control signal to produce a modified clock frequency.

3. The semiconductor integrated circuit device according to claim 1, wherein the first circuit generates the control signal having a logic level depending on a result of comparison of a frequency of a first internal clock and a frequency of a second internal clock, and the clock signal supplied to the second circuit is masked with the control signal to produce a modified clock frequency so that the modified clock frequency of the second circuit matches with the operating clock frequency of the first circuit.

4. The semiconductor integrated circuit device according to claim 1, wherein the first circuit comprises a memory controller and the second circuit comprises a memory, the memory controller controlling the memory by supplying the clock signal and the control signal to the memory.

5. The semiconductor integrated circuit device according to claim 1, wherein the first circuit generates the clock signal based on an externally generated input clock signal.

6. The semiconductor integrated circuit device according to claim 1, wherein the first circuit and the second circuit are provided on different semiconductor chips.

7. The semiconductor integrated circuit device according to claim 1, wherein the first circuit and the second circuit are provided on a single semiconductor chip.

8. A semiconductor integrated circuit device comprising:
a clock control unit generating a first internal clock and a second internal clock based on an externally generated input clock signal, and generating a first clock sync signal and a second clock sync signal based on a result of comparison of a frequency of the first internal clock and a frequency of the second internal clock; and
a first module receiving the first internal clock and the first and second clock sync signals and including an internal circuit which generates a clock enable signal used to control an operating clock frequency of a second module that operates on the basis of the frequency of the second internal clock,
wherein the semiconductor integrated circuit device synchronizes data transfer between the first module and the second module, regardless of whether an operating clock frequency of the first internal clock is changed to another clock frequency, by supplying the clock enable signal to the second module.

9. The semiconductor integrated circuit device according to claim 8, wherein the internal circuit generates an internal clock, which is provided within the first module, based on the first internal clock and the first clock sync signal.

10. The semiconductor integrated circuit device according to claim 8, wherein the internal circuit includes a phase matching circuit which generates a clock signal, which is supplied to the second module, based on the second internal clock, such that a phase of the generated clock signal matches with a phase of the second internal clock.

11. A semiconductor integrated circuit device comprising:
a clock control unit generating a variable-frequency first clock signal and a first clock sync signal; and
a first circuit receiving the first clock signal and the first clock sync signal and generating a fixed-frequency second clock signal and a second clock sync signal that are supplied to a second circuit, the first circuit and the second circuit performing data transfer between the first circuit and the second circuit,
wherein the semiconductor integrated circuit device synchronizes, when a frequency of the first clock signal is lower than a frequency of the second clock signal, the data transfer between the first circuit and the second circuit by causing the first circuit to supply the second clock sync signal to the second circuit.

12. The semiconductor integrated circuit device according to claim 11, wherein the clock control unit generates the first clock signal and the first clock sync signal based on an input clock signal, and the first circuit generates the second clock sync signal with a controlled frequency based on the first clock signal and the first clock sync signal.

* * * * *